United States Patent [19]

Kondō

[11] Patent Number: 5,107,209
[45] Date of Patent: Apr. 21, 1992

[54] POWER SUPPLY TESTING SYSTEM FOR NON-UTILITY POWER GENERATORS

[75] Inventor: Toyoshi Kondō, Tokyo, Japan
[73] Assignee: Tatsumi Corporation, Tokyo, Japan
[21] Appl. No.: 587,834
[22] Filed: Sep. 24, 1990
[51] Int. Cl.⁵ ............... G01R 31/00; H01C 10/02; G05F 3/00
[52] U.S. Cl. ............... 324/158 R; 324/158 MG; 323/296; 338/56; 338/82
[58] Field of Search ............ 324/425, 691, 158 R, 324/158 MG; 338/53, 55, 56, 80, 82, 222, 231; 323/296, 298, 364

[56] References Cited

U.S. PATENT DOCUMENTS

| | | | |
|---|---|---|---|
| 1,233,959 | 7/1917 | Bennett | 338/84 X |
| 4,510,483 | 4/1985 | Bensadoun | 338/80 |
| 4,670,735 | 6/1987 | Bensadoun | 338/86 X |
| 4,853,621 | 8/1989 | Matsumoto | 323/296 X |

Primary Examiner—Jack B. Harvey
Attorney, Agent, or Firm—Wenderoth, Lind & Ponack

[57] ABSTRACT

A power supply testing system for a non-utility power generator, etc. a plurality of tank units to be powered, which are provided depending upon the number of phases of a multi-phase AC power source used with the non-utility power generator and each of which includes a tank to be powered, having a resistive liquid filled therein, a depending main electrode located within the tank and adapted to receive a power from the non-utility power generator and a movable insulator interposed between the main electrode and the tank for regulating the amount of a current passed from the main electrode to the tank; an additional tank unit provided for spare purposes; a common unit located in communication within the plurality of tank units, in which the resistive liquids are collected from within the plurality of tank units; a main supply pipe located above the plurality of tank units to supply the resistive liquids thereto and a plurality of inlet pipes branching off from the main supply pipe into the plurality of tank units; and a flow rate regulator valve attached to each of the inlet branches for regulating the flow rate of the resistive liquid supplied to each tank unit.

3 Claims, 6 Drawing Sheets

POWER SUPPLY TESTING SYSTEM FOR NON-UTILITY POWER GENERATORS

BACKGROUND OF THE INVENTION

1. Field of the Invention

The present invention relates to a power supply testing system for non-utility power generators, etc. This testing system, for instance, is used to test the power output of an non-utility power generator provided in a high-rise building, etc. in order to cope with such an emergent situation as power breakdown.

2. Prior Art

Referring to FIG. 6, there is illustrated a typical system heretofore available in the art, in which three tanks 10 to be powered are provided, because a non-utility power generator to be subjected to power supply testing is generally of a three-phase AC type.

Within each or the tank 10 there is located a main electrode 14, the lower portion of which is supported on the bottom of the tank 10 through an insulator 100. Around the main electrode 14 there is located a cylindrical insulator 16 which is vertically displaceable, and the tank 10 is filled with a resistive liquid 12. The tank 10 and main electrode 14 are connected to a non-utility powder generator, not shown, by way of an output cable 104.

Then, a current is supplied between the tank 10 and the main electrode 14 for the required time to test the power generator for its output characteristics.

Load is regulated by the vertical displacement of the insulator 16, and the resistive liquid 12 heated during testing is pumped out by a pump 40 and fed through drain pipes 110 and 112 to a radiator 42 wherein it is cooled down and whence it is then returned to the tank 10 through supply pipes 106 and 108.

With the above-mentioned prior art testing system, however, there is a variation of as large as 15° C. in the liquid temperature rise between the tanks 10 to be powered during testing.

For that reason, the resistance (or current) values of the tanks 10 are so varied that a serious difficulty is encountered in keeping the load, an important factor for testing, well-balanced. This in turn makes it very difficult to perform a power supply testing accurately.

When a certain tank 10 or electrode 14 breaks down during testing, the testing should immediately be stopped. In other words, even a breakdown of one tank renders the testing system unserviceable.

In view of the foregoing, it is therefore an object of this invention to provide a power supply testing system which assures a simple but accurate power supply testing and continues to work even when a certain tank or electrode breaks down during testing.

SUMMARY OF THE INVENTION

In order to achieve the above-mentioned object, the testing system according to this invention is constructed as follows.

Referring to FIG. 1, there is shown a general embodiment of the testing system according to this invention.

As illustrated, located above a common unit 20 are a plurality of tank units 18 to be powered, each including a tank 10 to be powered, a main electrode 14 and a movable insulator 16. How many the tank units 18 are located is determined by the number of phases of a non-utility power generator. At least one additional tank unit 18 is provided for spare purposes.

The tank 10 is filled with a resistive liquid, and includes a depending main electrode 14 which is supported above. This electrode 14 is powered by a non-utility power generator, etc. to be tested.

Between the tank 10 and the main electrode 14 there is interposed the movable insulator 16 for regulating the amount of a current passed therebetween.

Each or the tank 10 receives an inlet pipe 24 for feeding the resistive liquid 12 to it, which branches off from a main supply pipe 22. As can also be understood from FIG. 1, each or the inlet branch 24 is provided with a flow rate regulator member 26 for regulating the flow rate of the resistive liquid 12.

According to this invention, the resistive liquids 12 filled in the tanks 10 for regular service can be maintained at a substantially constant temperature, since the resistive liquid 12 filled in the tank unit 18 for spare purposes (which undergoes no temperature rise even during testing) is distributed to the resistive liquids 12 contained in the tank units 18 for regular service, so that their temperature increases can be leveled out.

Further, at least one tank unit 18 provided for spare purposes assures that the testing system can continue to work even when a certain tank 10 or electrode 14 breaks down.

Still further, the regulator 26 for regulating the flow rate of the resistive liquid 12 attached to each tank 10 makes it possible to provide a more accurately controlled leveling-out of the liquid temperature rises in the tanks 10.

BRIEF DESCRIPTION OF THE DRAWINGS

The present invention will now be explained specifically but not exclusively with reference to the accompanying drawings, in which.

DETAILED EXPLANATION OF THE PREFERRED EBMODIMENTS

Figure 1:
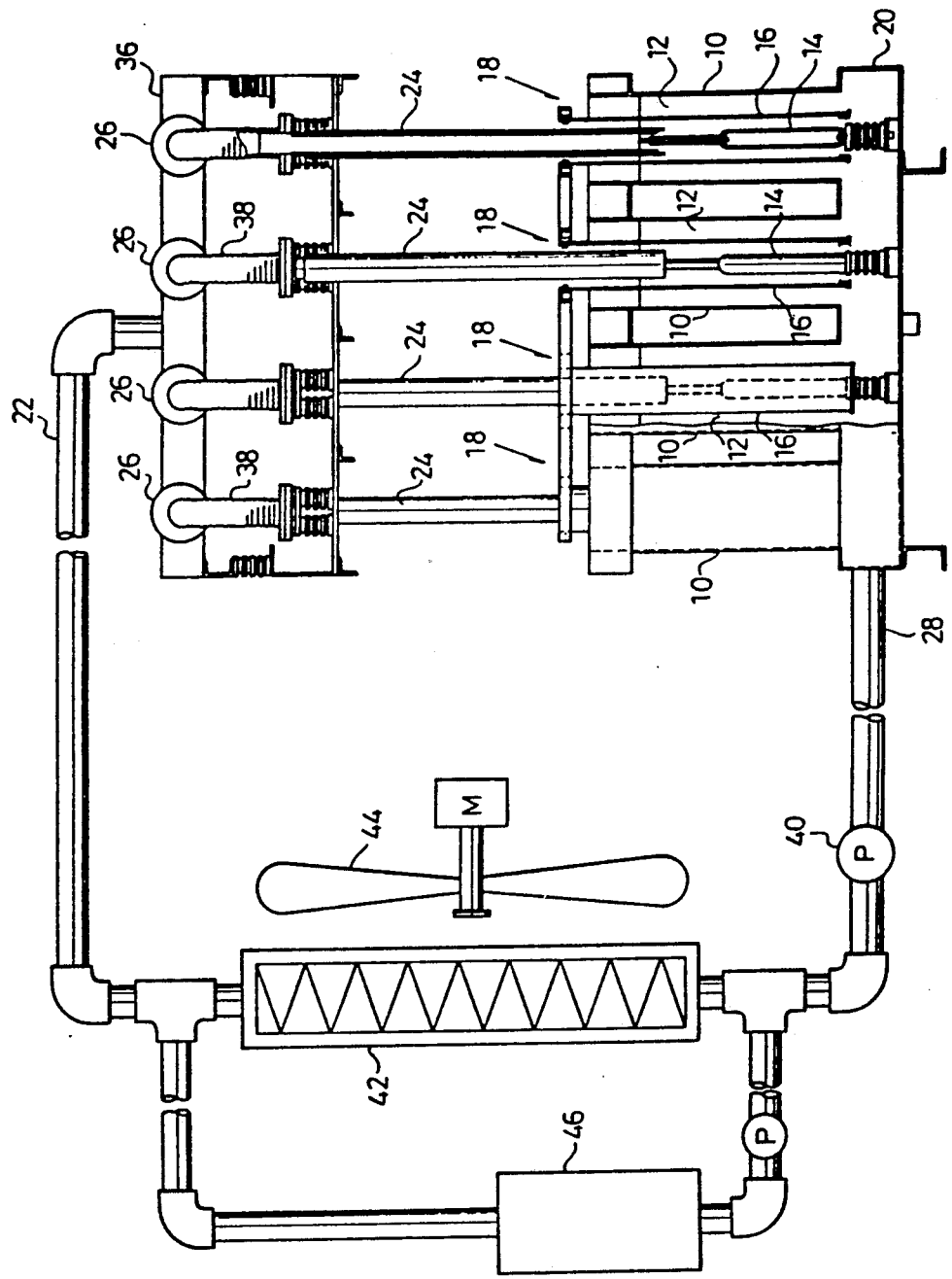
FIG. 1 is a general front view of one preferred embodiment according to this invention.

Referring to FIG. 1 showing a general structure of the testing system according to this invention, four tank units 18 to be powered are located above a common unit 20.

Of these tank units, one is a spare, because a generally available power generator is of a three-phase AC type.

Each tank unit 18 includes a substantially cylindrical tank 10 to be powdered, which is located above the common unit 20, a depending main electrode 14 housed in the tank 10, and a movable insulator 16 interposed between the tank 10 and the main electrode 14. The tank 10 is filled with a resistive liquid 12, for which water is usually employed.

It is noted that the tank 10 is provided on its upper end with an overflow receiver member 11 to accommodate to the expansion of the resistive liquid 12 heated at an initial stage of testing, thereby ensuring that a water leakage is prevented, contributing to greater safety.

The tank 10 and main electrode 14 are both in cylindrical forms for permitting a current to be smoothly supplied between them.

The common unit 20 serves to collect the resistive liquids 12 located above it and feed them to a radiator 42 to be described later.

The common unit 20 also serves to receive an amount of air produced in the tanks 10 in operation and carry it to the spare tank 10 for venting. This is because when much air is entrained in the tank 10, an arc occurs during testing, putting load in a state so ill-balanced that no accurate testing is achievable.

It is understood that an inlet pipe 24 covered with an insulating material such as Teflon extends from above into the tank 10, supporting the main electrode 14.

As illustrated in FIG. 1, the inlet pipe 24 is provided at its upper end with a connecting terminal bar 32 through an insulator 30. The bar 32 is in turn connected with a cable of the non-utility power generator to be tested to supply a current between the main electrode 14 and the tank 10.

Figure 2:
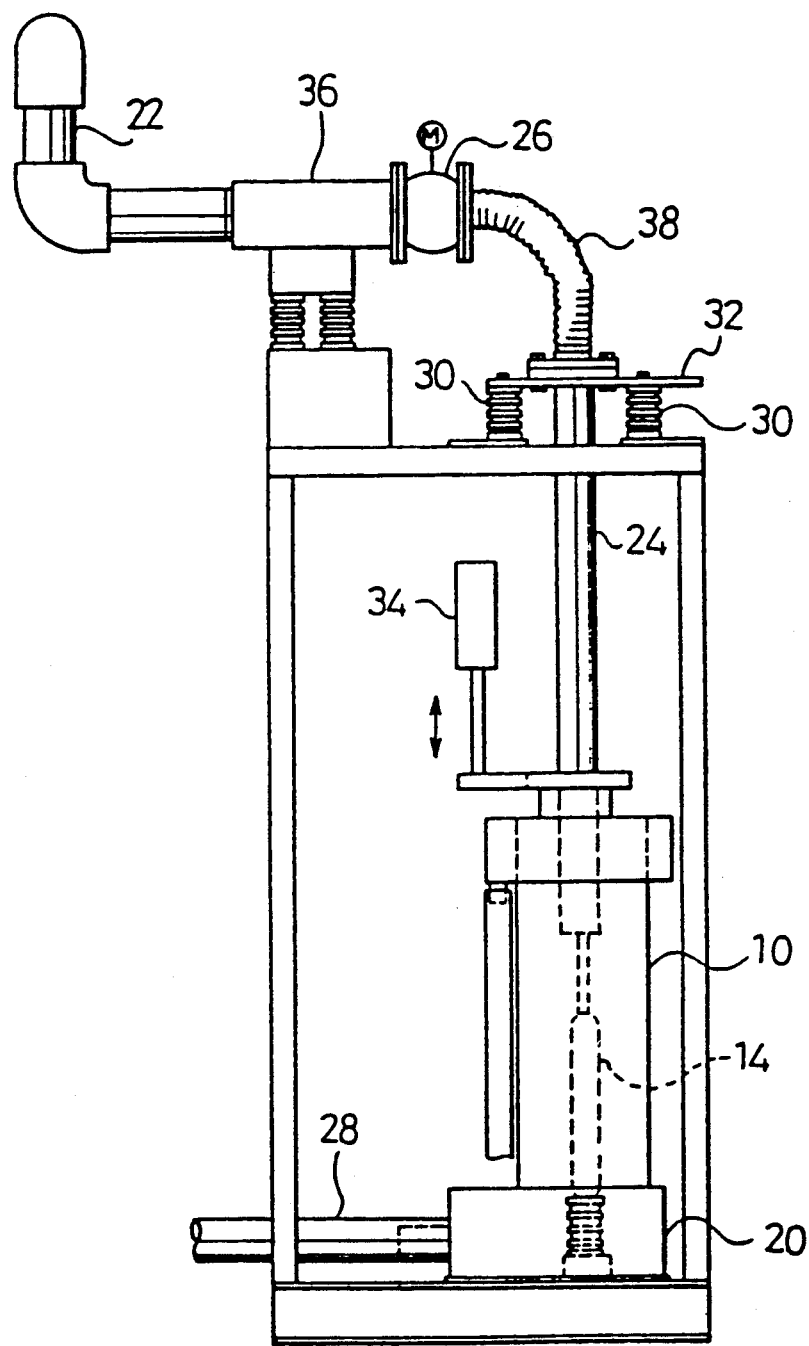
FIG. 2 is a side view of FIG. 1.

As again shown in FIG. 2, the movable insulator 16 interposed between the tank 10 and the main electrode 14 is supported by an elevator 34.

As the movable insulator 16 is vertically displaced by the elevator 34, the areas of the electrode 14 and tank 10 capable of being powered are varied to regulate the amount of the current supplied.

Above the tanks 10 there is located a common expansion tank 36, which is connected with a plurality of the inlet pipes 24 by way of flexible hoses 38 resistant to voltage and corrosion.

The expansion tank 36 is provided with a main supply pipe 22 for supplying the resistive liquid 12, and between the expansion tank 36 and each flexible hose 38 there is mounted a regulator valve 26 for regulating the flow rate of the resistive liquid 12 flowing toward the inlet branch 24.

The common unit 20 located below the tanks 10 is provided with a drain pipe 28 for draining off the resistive liquid 12, said drain pipe 28 being equipped with a pump 40.

Figure 3:
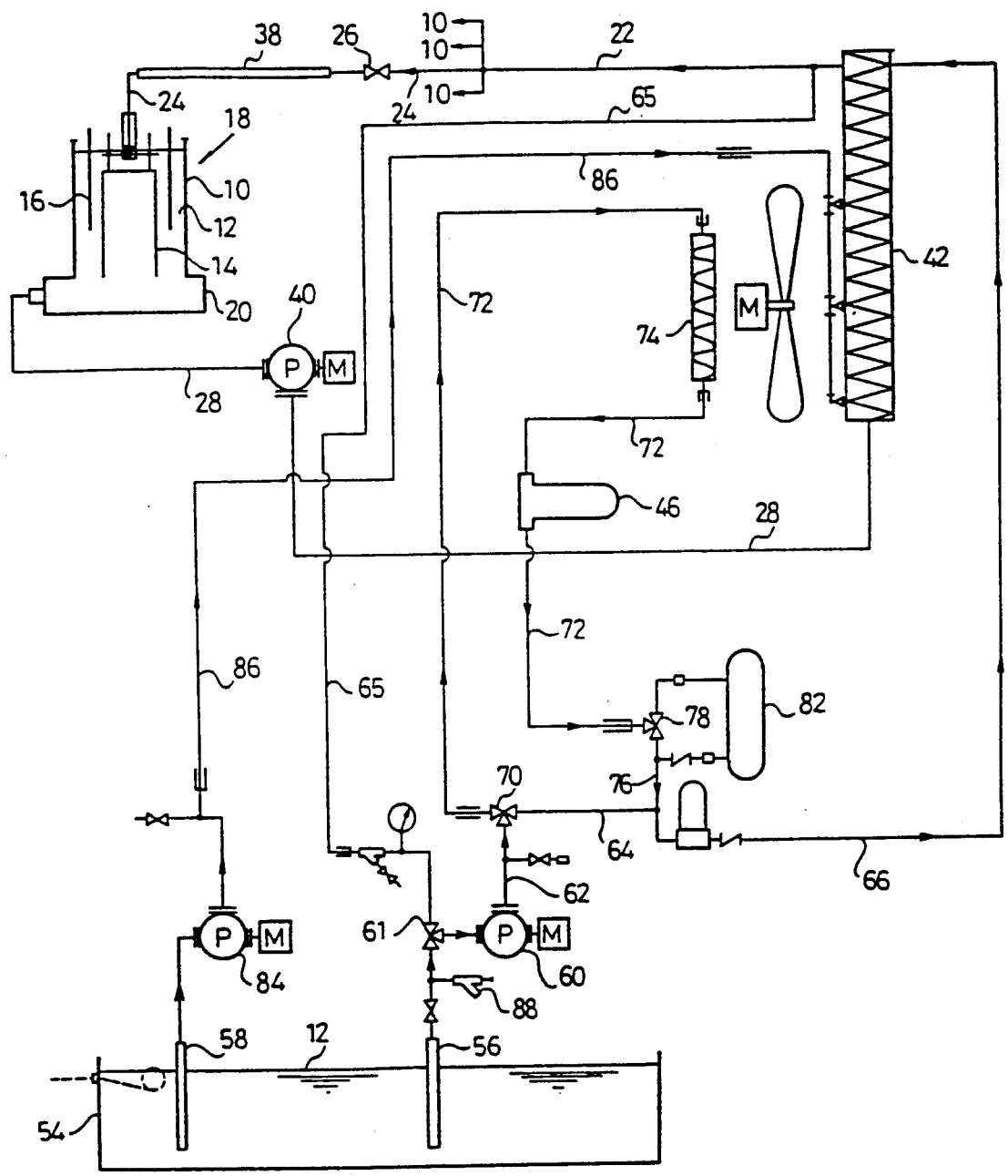
FIG. 3 is a piping circuit view showing details of the flow passages of a resistive liquid.
Figure 4:
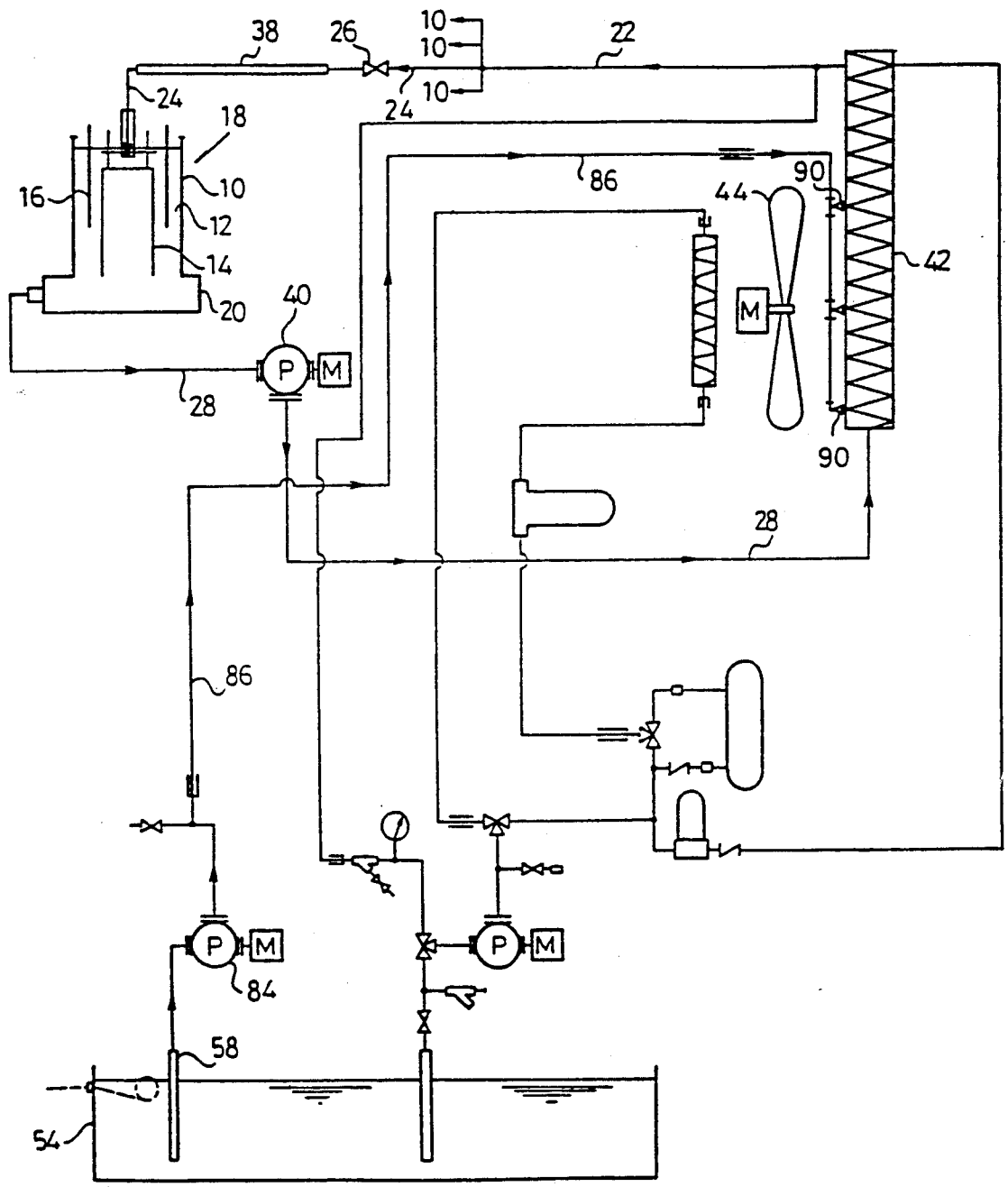
FIGS. 4 and 5 are piping circuit views providing an illustration of how the resistive liquid flowing through the passages works.
Figure 5:
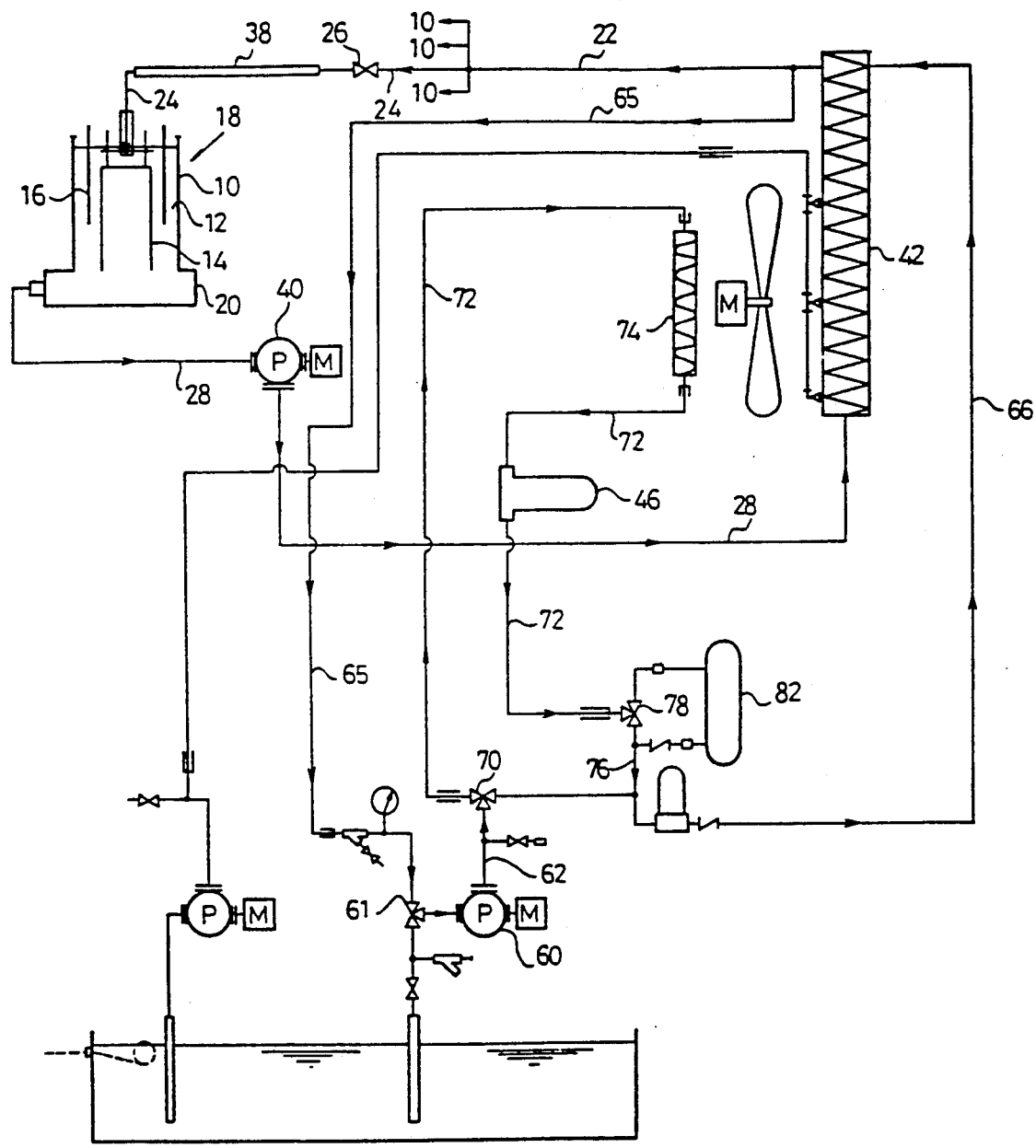
Figure 6:
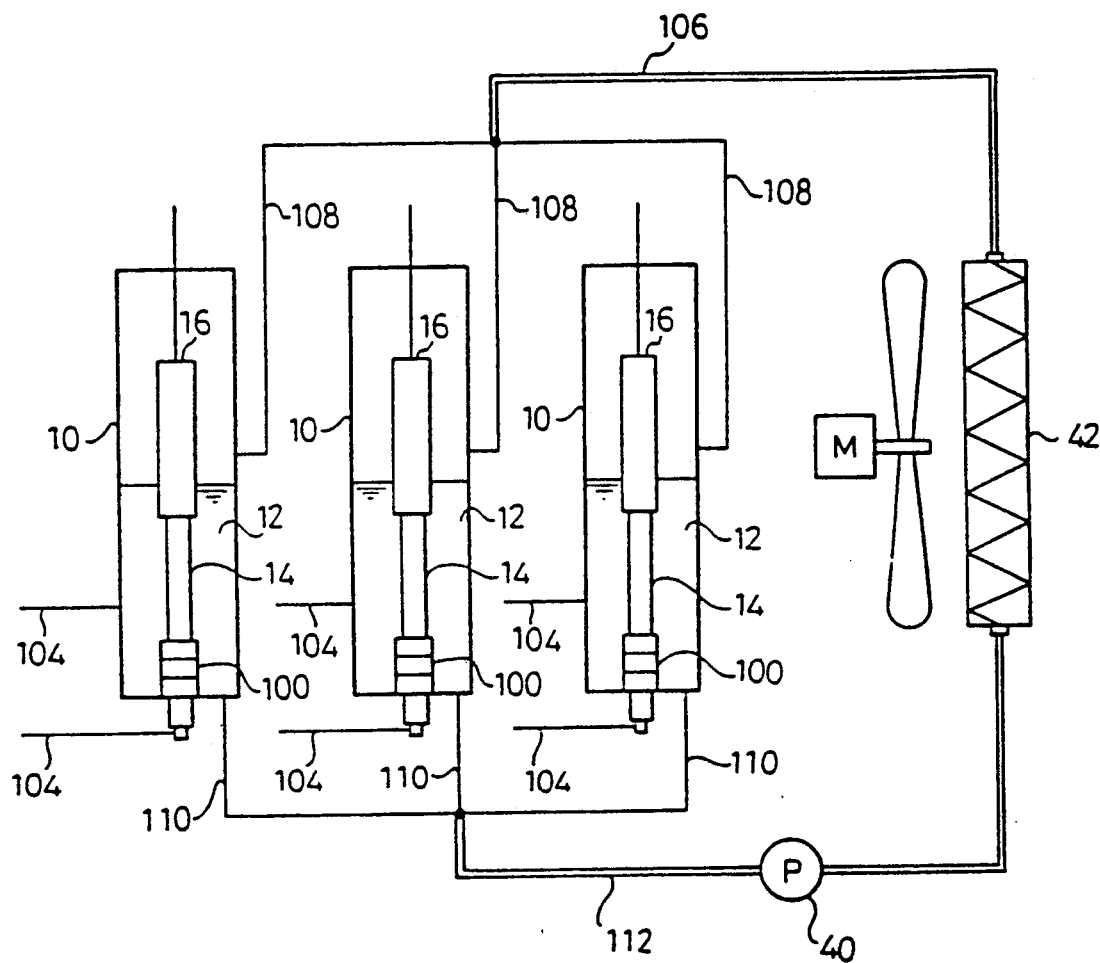
FIG. 6 is a schematic view of one conventional system.

The drain pipe 28 is connected to the radiator 42 having its outlet side connected with the main supply pipe 22 (see FIGS. 1 and 3).

The resistive liquids 12 heated in the tanks 10 are fed through the drain pipe 18 to the radiator 42 in which they are combined together and heat-exchanged or cooled down. Afterwards, the combined and cooled liquid is again distributed to the tanks 10 through the associated flexible hoses 38 and inlet branches 24.

In this case, the regulator valve 26 of the spare tank unit 18 is so closed that the resistive liquids 12 can circulate through the remaining tank units 18.

Although the resistive liquid 12 does not circulate through the spare tank 10 as mentioned above, it is distributed from the spare tank 10 to the resistive liquids 12 contained in the other tanks 10, so that the temperatures of the resistive liquids 12 in the three tanks 10 in operation can be substantially leveled out in cooperation with the flow rate regulation achieved by the aforesaid regulator valves 26. Thus, the loads on the tanks remain so well-balanced that an accurate testing can be performed.

In order to prevent the temperature of the resistive liquid 12 from exceeding the predetermined value during operation, the radiator 42 is cooled by a fan 44.

It is understood that the resistive liquid 12, if required, may be filtered through a filter 46 (especially when the testing system is used for a high-voltage testing).

Referring to FIG. 3 showing a detailed circuit through which the resistive liquid 12 is to flow, the drain pipe 28 attached to the common unit 20 is connected at the other side to the inlet side of the radiator 42 through the pump 40.

The radiator 42 is also connected on the outlet side with the main supply pipe 22.

Each inlet pipe 24 branching off from the main supply pipe 22 is provided with the flow rate regulator valve 26.

A liquid reservoir 54 containing a large amount of the resistive liquid 12 includes downwardly extending intake pipes 56 and 58, the former of which is connected to the main supply pipe 22 by way of a pump 60 as well as pipes 62, 64 and 66.

Through a changeover valve 61 and a pipe 65, the pump 60 is connected to the main supply pipe 22 through which the resistive liquid 12 leaving the radiator 42 flows.

The pipes 64 and 76 are connected with changeover valves 70 and 78, respectively.

Connected between the changeover valve 70 and the pipe 76 is a pipe 72 which is in turn connected with a radiator 74 and the filter 46. The changeover valve 78 is connected on the other side with a water purifier 82.

The intake pipe 58 is connected to a spray pipe 86 through a pump 84.

Reference will now be made to how the flowing circuit works. As illustrated, the resistive liquid 12 (or tap water) is pumped out from within the reservoir 54 through the intake pipe 56 (or from a tap 88), and is then supplied through the pipes 62 and 72, radiator 74, filter 46 and pipe 66 (if required, through the water purifier 82) to the main supply pipe 22, whence it is filled into the tanks 10 through the associated inlet branches 24.

As the tanks 10 are filled with the resistive liquids 12, the power generator connected to the tanks 10 and main electrodes 14 by way of cables, not shown, is put in operation and tested for a given time.

By way of example, a power output testing may be carried out for about 3 hours with a power generator having an output of 1000 KVA, a power factor of 0.8, a voltage of 415 V and a current value of 642.6 A.

During the testing, the resistive liquids 12 are fed by the circulating pump 40 from within the tanks 10 to the radiator 42 through the drain pipe 28, in which they are combined together and cooled down. Afterwards, the combined and cooled liquid is again supplied to the tanks 10 through the main supply pipe 22 and then the inlet branches 24.

In the meantime, the fan 44 is driven while the resistive liquid 12 is pumped out of the reservoir 54 by a pump 84 and blown onto the radiator 42 from an injecting nozzle 90 through the intake pipe 58 and spray pipe 86.

Then, the temperature of the resistive liquid 12 in each tank 10 is so sensed to control the rotation of the fan 44 that it is always kept constant.

In the present invention, it is to be noted that since the resistive liquid 12 is circulated for reuse, it is likely to be contaminated with impurities in each tank 10 during testing.

If the resistive liquid 12 decreases in purity by contamination with impurities (esp. during a high-voltage testing), then its conductivity increases, causing trouble to the power output testing.

Such contamination has a particularly serious influence upon the high-voltage testing, since the resistive liquid 12 used therefor is pure water.

In the illustrated embodiment, therefore, the resistive liquid 12 may be flushed during the testing.

For flushing, the valves 61 and 67 are changed over, as illustrated in FIG. 3, to supply the resistive liquid 12 cooled down in the radiator 42 to the pipe 62 through the pipe 65 by the pump 60, whence it is supplied through the pipe 72 to the separate radiator 74 for further cooling.

The resistive liquid 12 leaving the radiator 74 is supplied through the pipe 72 to the filter 46 in which it is filtered. If required, it is further supplied to the water purifier 82 in which its purity is increased.

The resistive liquid 12 with an increased purity is supplied through the pipe 66, main supply pipe 22 and inlet branches 24 into the tanks 10.

According to the instant embodiment as detailed above, there are provided four tank units 18 leading to the common unit 20. Of these tank units, one is used for spare purposes. The resistive liquid contained in this spare unit can be used to substantially level out the temperatures of the liquids contained in the remaining three tanks 10 in operation.

Thus, the tanks' internal resistivities are kept so constant that the loads thereon can be leveled out, making it possible to test a non-utility power generator accurately.

The flow rate of the resistive liquid 12 supplied to each tank 10 is so controlled by the associated flow rate regulator valve 26 that its temperature can be controlled more accurately.

Including the spare tank unit 18, the instant testing system can continue to work by changeover operation, even when a certain tank 10 or electrode 14 breaks down during testing.

Since the resistive liquid 12 is not circulated through the spare tank 10, it is also possible to vent air from the common tank 20 through the spare tank.

It is therefore unlikely that air may be entrained in the tanks 10 in operation, contributing to greater safety during testing.

Whether or not the resistive liquid 12 is contaminated with impurities can easily be ascertained by seeing through the spare tank 10.

Since the main electrode 14 is supported at its upper portion by the inlet pipe 24 and disposed within the associated tank 10 in a depending manner, it is so unnecessary to form any hole through the bottom of the common tank 20 that the liquid is most unlikely to leak from the common unit 20.

It will be understood that while the present invention has been described specifically with reference to its specifically preferred embodiment, many modifications or changes may be possible within the scope of the invention defined by the appended claims.

What is claimed is:

1. A power supply testing system for a non-utility power generator, comprising:
   a plurality of tank units to be powered, which are provided depending upon the number of phases of a multi-phase AC power source used with the non-utility power generator and each of which includes a tank to be powered, having a resistive liquid filled therein, a depending main electrode located within said tank and adapted to receive a power from the non-utility power generator and a movable insulator interposed between said main electrode and said tank for regulating the amount of a current passed from said main electrode to said tank;
   an additional tank unit provided for spare purposes;
   a common unit located in communication within said plurality of tank units, in which said resistive liquids are collected from within said plurality of tank units;
   a main supply pipe located above said plurality of tank units to supply said resistive liquids thereto and a plurality of inlet pipes branching off from said main supply pipe into said plurality of tank units; and
   a flow rate regulator valve attached to each of said inlet branches for regulating the flow rate of said resistive liquid supplied to each tank unit.

2. A power supply testing system as claimed in claim 1, which includes three such tank units depending upon a three-phase AC power source generated by the non-utility power generator and an additional one such tank unit for spare purposes.

3. A power supply testing system as claimed in claim 1, wherein said tanks and main electrodes are both in substantially cylindrical forms.

* * * * *